(12) United States Patent
Chang

(10) Patent No.: US 11,145,519 B2
(45) Date of Patent: *Oct. 12, 2021

(54) MECHANISMS FOR FORMING PATTERNS USING MULTIPLE LITHOGRAPHY PROCESSES

(71) Applicant: Taiwan Semiconductor Manufacturing Company, Ltd., Hsin-Chu (TW)

(72) Inventor: Shih-Ming Chang, Hsinchu County (TW)

(73) Assignee: TAIWAN SEMICONDUCTOR MANUFACTURING COMPANY, LTD., Hsin-Chu (TW)

(*) Notice: Subject to any disclaimer, the term of this patent is extended or adjusted under 35 U.S.C. 154(b) by 78 days.

This patent is subject to a terminal disclaimer.

(21) Appl. No.: 16/229,764

(22) Filed: Dec. 21, 2018

(65) Prior Publication Data

US 2019/0148162 A1 May 16, 2019

Related U.S. Application Data

(62) Division of application No. 14/334,958, filed on Jul. 18, 2014, now Pat. No. 10,163,652.

(Continued)

(51) Int. Cl.
*H01L 21/027* (2006.01)
*H01L 21/033* (2006.01)
(Continued)

(52) U.S. Cl.
CPC .... *H01L 21/31144* (2013.01); *H01L 21/0337* (2013.01); *H01L 21/32139* (2013.01);
(Continued)

(58) Field of Classification Search
CPC ............ H01L 21/0337; H01L 21/3081; H01L 21/3083; H01L 21/3086; H01L 21/31144; H01L 21/32139
See application file for complete search history.

(56) References Cited

U.S. PATENT DOCUMENTS 2,290,317 A 7/1942 Deakin
2,352,188 A 6/1944 Farrell
(Continued)

FOREIGN PATENT DOCUMENTS

JP 2006189986 7/2006
JP 2005293097 10/2015

OTHER PUBLICATIONS

U.S. Appl. No. 62/019,100, filed Jun. 30, 2014, by inventors Shih-Ming Chang for "Mechanisms for Forming Patterns Using Multiple Lithography Processes," 29 pages of text, 12 pages of drawings.

(Continued)

*Primary Examiner* — Mary A Wilczewski
(74) *Attorney, Agent, or Firm* — Haynes and Boone, LLP

(57) ABSTRACT

The present disclosure provides a method for forming patterns in a semiconductor device. In accordance with some embodiments, the method includes providing a substrate and a patterning-target layer formed over the substrate; forming a first cut pattern in a first hard mask layer formed over the patterning-target layer; forming a second cut pattern in a second hard mask layer formed over the patterning layer, the first hard mask layer having a different etching selectivity from the second hard mask layer; selectively removing a portion of the second cut pattern in the second hard mask layer and a portion of the patterning-target layer within a first trench; and selectively removing a portion of the first (Continued)

cut pattern in the first hard mask layer and a portion of the patterning-target layer within a second trench.

20 Claims, 11 Drawing Sheets

Related U.S. Application Data

(60) Provisional application No. 62/019,063, filed on Jun. 30, 2014.

(51) Int. Cl.
*H01L 21/306* (2006.01)
*H01L 21/308* (2006.01)
*H01L 21/311* (2006.01)
*H01L 21/3213* (2006.01)

(52) U.S. Cl.
CPC ...... *H01L 21/3081* (2013.01); *H01L 21/3083* (2013.01); *H01L 21/3086* (2013.01)

(56) References Cited

U.S. PATENT DOCUMENTS

| | | | |
|---|---|---|---|
| 4,577,744 | A | 3/1986 | Doucet |
| 4,969,549 | A | 11/1990 | Eglise |
| 6,184,128 | B1 | 2/2001 | Wang et al. |
| 6,327,902 | B1 | 12/2001 | Hantschel et al. |
| 6,368,979 | B1 | 4/2002 | Wang et al. |
| 6,440,858 | B1 | 8/2002 | Canale et al. |
| 6,472,315 | B2 | 10/2002 | Nguyen et al. |
| 6,514,852 | B2 | 2/2003 | Usami |
| 6,534,809 | B2 | 3/2003 | Moise et al. |
| 6,550,600 | B2 | 4/2003 | Faes et al. |
| 6,605,545 | B2 | 8/2003 | Wang |
| 6,835,662 | B1 | 12/2004 | Erhardt et al. |
| 6,930,036 | B2 | 8/2005 | Usami |
| 6,951,709 | B2 | 10/2005 | Li |
| 7,057,286 | B2 | 6/2006 | Usami |
| 7,074,527 | B2 | 7/2006 | Lu et al. |
| 7,115,525 | B2 | 10/2006 | Abatchev et al. |
| 8,039,179 | B2 | 10/2011 | Shieh et al. |
| 8,202,681 | B2 | 6/2012 | Lin et al. |
| 8,247,291 | B2 | 8/2012 | Min et al. |
| 8,298,943 | B1 | 10/2012 | Arnold et al. |
| 8,609,495 | B2 | 12/2013 | Gan et al. |
| 8,728,332 | B2 | 5/2014 | Lin et al. |
| 8,822,243 | B2 | 9/2014 | Yan et al. |
| 9,245,763 | B2 | 1/2016 | Chang et al. |
| 9,263,282 | B2 | 2/2016 | Lin et al. |
| 9,293,341 | B2 | 3/2016 | Chang |
| 9,373,582 | B1 | 6/2016 | Feurprier et al. |
| 9,378,973 | B1 | 6/2016 | Tung et al. |
| 9,394,570 | B2 | 7/2016 | Sung et al. |
| 9,418,868 | B1 | 8/2016 | Yen et al. |
| 9,583,381 | B2 | 2/2017 | Khurana et al. |
| 9,634,012 | B2 | 4/2017 | Park et al. |
| 9,761,436 | B2 * | 9/2017 | Chang ............ H01L 21/823431 |
| 9,875,906 | B2 | 1/2018 | Chang |
| 10,163,652 | B2 | 12/2018 | Chang |
| 10,276,363 | B2 * | 4/2019 | Chang ............... H01L 21/76816 |
| 10,770,303 | B2 * | 9/2020 | Chang ............... H01L 29/66795 |
| 2002/0182874 | A1 | 12/2002 | Wang |
| 2002/0187629 | A1 | 12/2002 | Huang et al. |
| 2004/0183139 | A1 | 9/2004 | Kim |
| 2005/0064299 | A1 | 3/2005 | Lu et al. |
| 2005/0208742 | A1 | 9/2005 | America et al. |
| 2006/0091468 | A1 | 5/2006 | Liaw |
| 2007/0170497 | A1 | 7/2007 | Baek |
| 2007/0184606 | A1 | 8/2007 | You et al. |
| 2007/0238053 | A1 | 10/2007 | Hashimoto |
| 2007/0259499 | A1 | 11/2007 | Eun et al. |
| 2008/0001211 | A1 | 1/2008 | Cho et al. |
| 2009/0087786 | A1 | 4/2009 | Hatakeyama |
| 2009/0117739 | A1 | 5/2009 | Shin et al. |
| 2009/0194840 | A1 | 8/2009 | Noelscher et al. |
| 2009/0311861 | A1 | 12/2009 | Park et al. |
| 2010/0055914 | A1 | 3/2010 | Min et al. |
| 2010/0096719 | A1 | 4/2010 | Lee et al. |
| 2010/0159404 | A1 | 6/2010 | Hatakeyama et al. |
| 2010/0173492 | A1 | 7/2010 | Kim et al. |
| 2010/0203734 | A1 | 8/2010 | Shieh et al. |
| 2010/0209849 | A1 | 8/2010 | Watanabe et al. |
| 2010/0297554 | A1 | 11/2010 | Watanabe et al. |
| 2011/0183505 | A1 | 7/2011 | Min et al. |
| 2011/0281208 | A1 | 11/2011 | Lin et al. |
| 2012/0156866 | A1 | 6/2012 | Ahn |
| 2012/0202301 | A1 | 8/2012 | Yaegashi |
| 2012/0278776 | A1 | 11/2012 | Lei et al. |
| 2013/0295769 | A1 | 11/2013 | Lin et al. |
| 2013/0320451 | A1 | 12/2013 | Liu et al. |
| 2014/0193974 | A1 | 7/2014 | Lee et al. |
| 2014/0215421 | A1 | 7/2014 | Chen et al. |
| 2014/0242794 | A1 | 8/2014 | Lin et al. |
| 2014/0264760 | A1 | 9/2014 | Chang et al. |
| 2014/0264899 | A1 | 9/2014 | Chang et al. |
| 2014/0273442 | A1 | 9/2014 | Liu et al. |
| 2014/0273446 | A1 | 9/2014 | Huang et al. |
| 2015/0262830 | A1 * | 9/2015 | Chang ................. H01L 21/0337 438/702 |
| 2015/0380256 | A1 | 12/2015 | Chang |
| 2015/0380259 | A1 | 12/2015 | Chang |
| 2015/0380261 | A1 * | 12/2015 | Chang ............... H01L 21/3065 438/690 |
| 2016/0172194 | A1 * | 6/2016 | Kunnen ........... H01L 21/31144 257/618 |
| 2016/0203991 | A1 | 7/2016 | Chang |
| 2016/0284590 | A1 | 9/2016 | Yen |
| 2017/0372891 | A1 * | 12/2017 | Chang ................. H01L 21/302 |
| 2019/0259600 | A1 * | 8/2019 | Chang ................. G03F 7/70466 |
| 2021/0035863 | A1 * | 2/2021 | Zhong ............... H01L 21/02532 |

OTHER PUBLICATIONS

U.S. Appl. No. 62/019,127, filed Jun. 30, 2014, by inventors Shih-Ming Chang, Ming-Feng Shieh, Chih-Ming Lai, Ru-Gun Liu, and Tsai-Sheng Gau for "Mechanisms for Forming Patterns Using Multiple Lithography Processes," 40 pages of text, 19 pages of drawings.

* cited by examiner

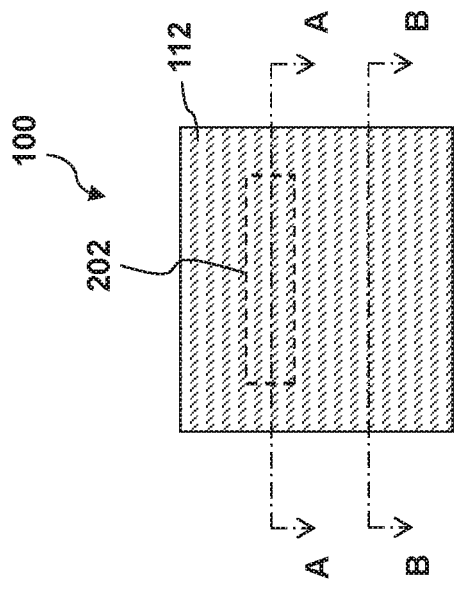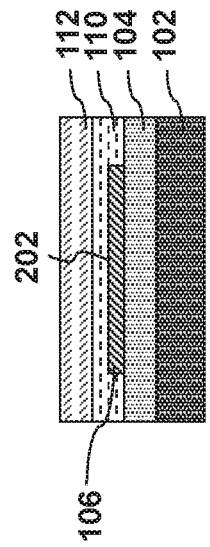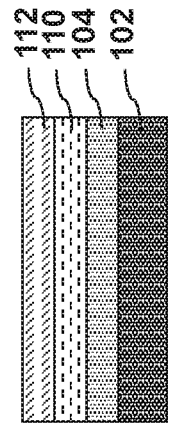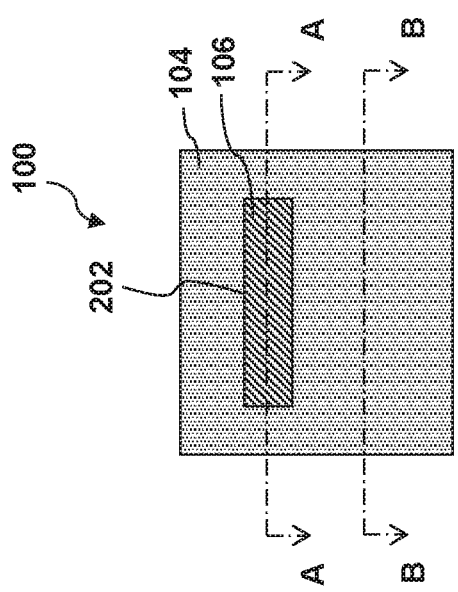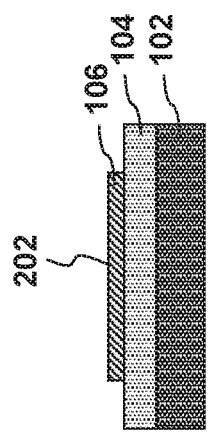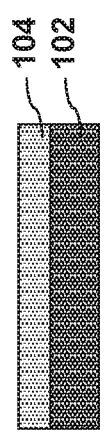

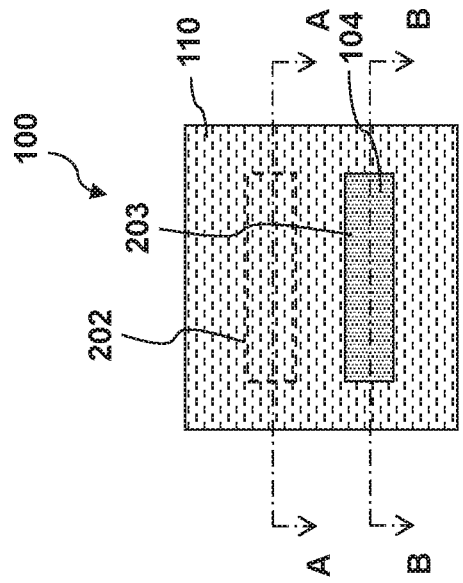
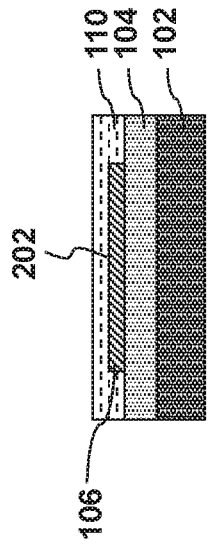
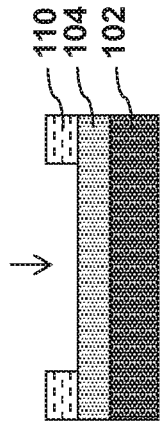
FIG. 6A
FIG. 6B
FIG. 6C
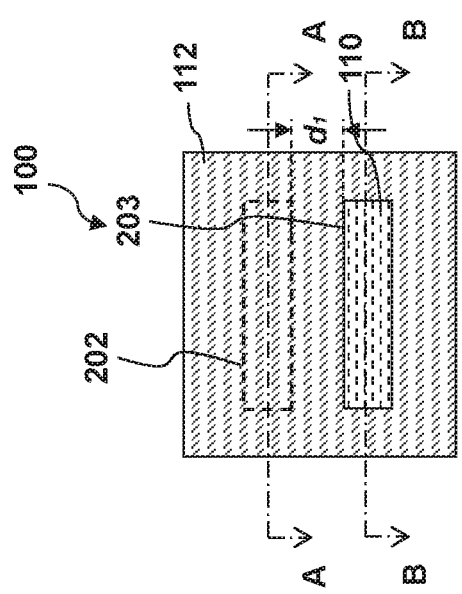
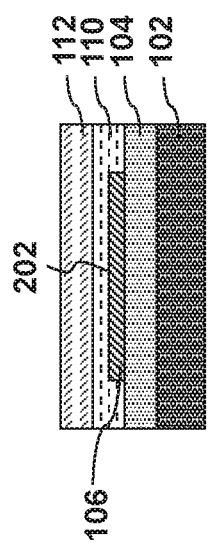
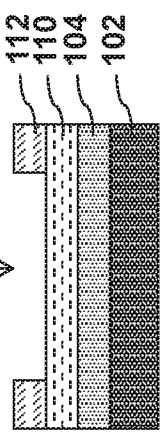
FIG. 5A
FIG. 5B
FIG. 5C

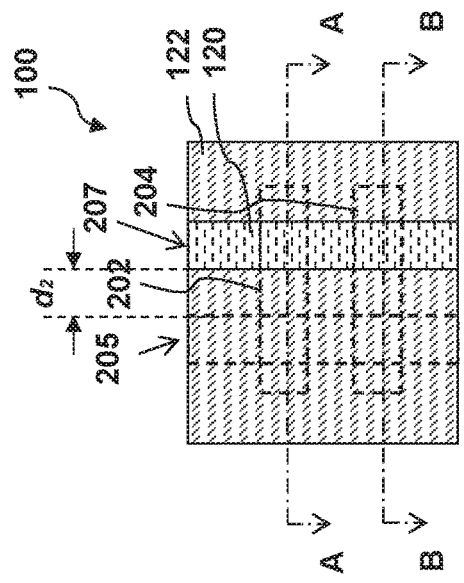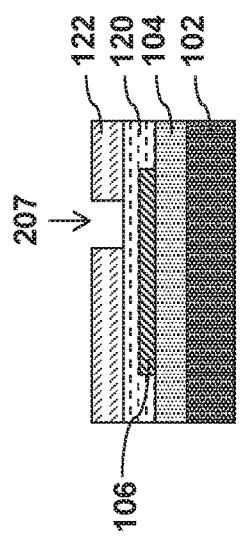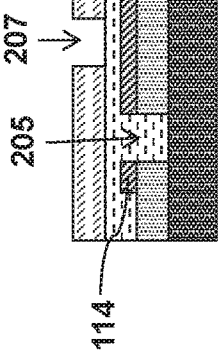
FIG. 16A  FIG. 16B  FIG. 16C
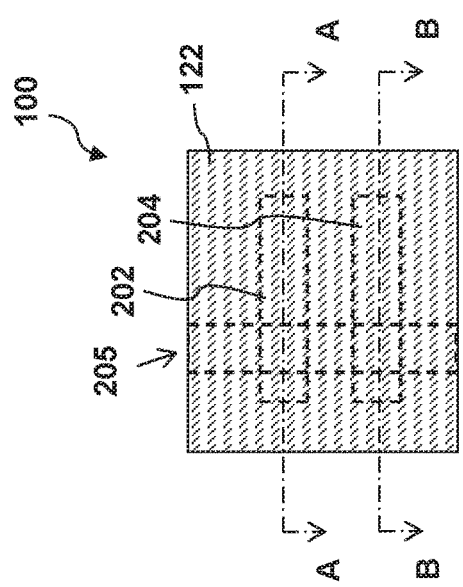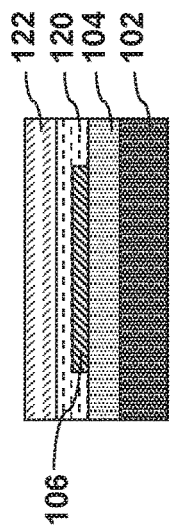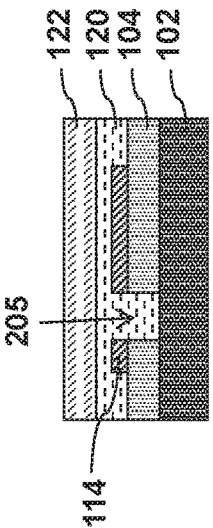
FIG. 15A  FIG. 15B  FIG. 15C

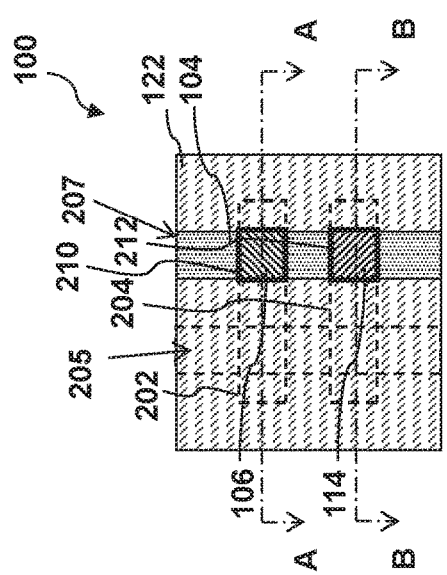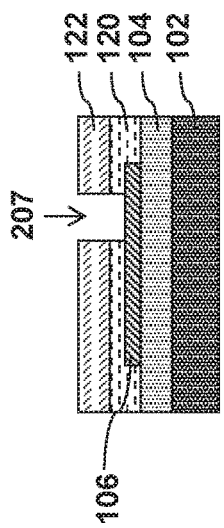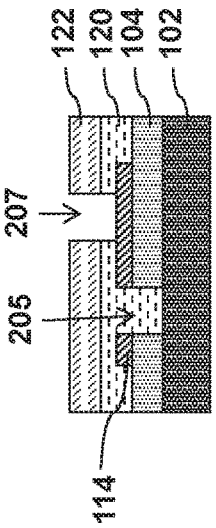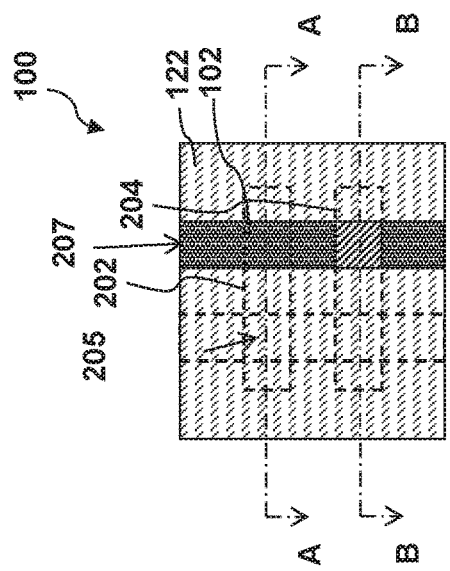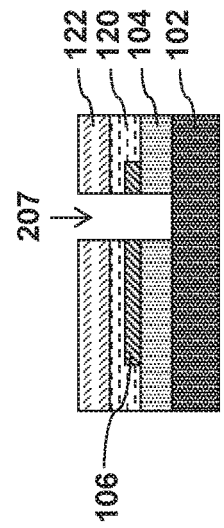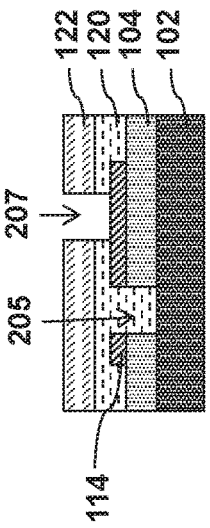

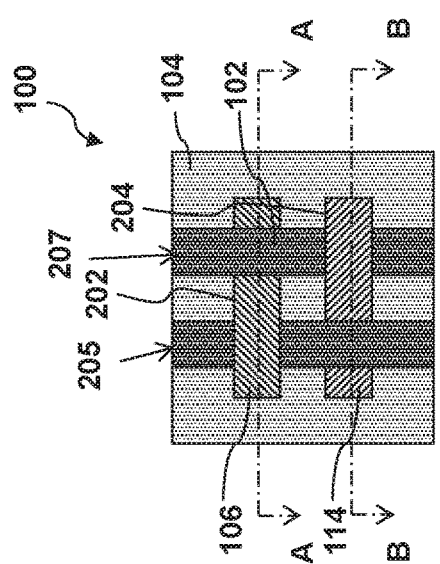
FIG. 19A
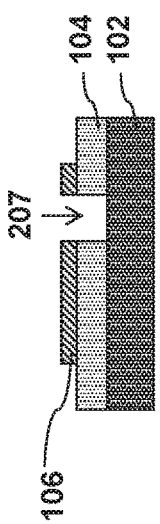
FIG. 19B
FIG. 19C
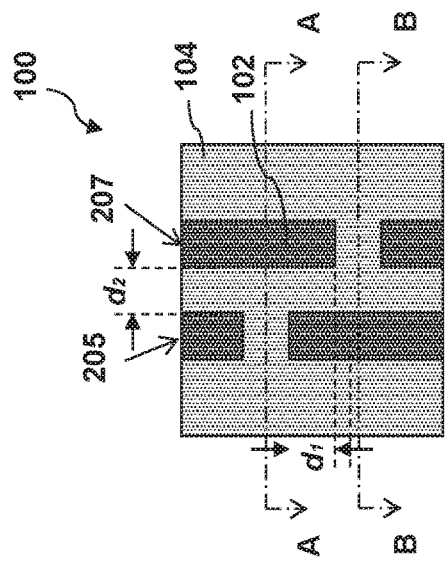
FIG. 20A
FIG. 20B
FIG. 20C

MECHANISMS FOR FORMING PATTERNS USING MULTIPLE LITHOGRAPHY PROCESSES

CROSS-REFERENCE TO RELATED APPLICATION

This application is a divisional application of U.S. patent application Ser. No. 14/334,958 filed Jul. 18, 2014, which claims priority to U.S. Provisional Patent Application Ser. No. 62/019,063 filed Jun. 30, 2014, the entire disclosure of each of which is hereby incorporated herein by reference.

The present disclosure is related to the following commonly-assigned patent applications, the entire disclosures of which are incorporated herein by reference: U.S. Provisional Patent Application Ser. No. 62/019,100 filed on Jun. 30, 2014, entitled "Mechanisms for Forming Patterns Using Multiple Lithography Processes", U.S. patent application Ser. No. 14/210,032 filed on Mar. 13, 2014, entitled "Mechanisms for Forming Patterns Using Multiple Lithography Processes", and U.S. Provisional Patent Application Ser. No. 62/019,127 filed on Jun. 30, 2014, entitled "Mechanisms for Forming Patterns Using Multiple Lithography Processes".

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

In the course of these benefits, efforts have been made to develop fabrication methods to realize the desire for smaller feature sizes. For example, methods have been developed to reduce the pitch of features on a substrate without changing the photolithography technology used. However, current methods have not been satisfactory in all respects. For example, process windows of critical dimension (CD) uniformity control and process flexibility of forming special features may be not sufficient.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A, 2A, 3A, 4A, 5A, 6A, 7A, 8A, 9A, 10A, 11A, 12A, 13A, 14A, 15A, 16A, 17A, 18A, 19A, and 20A are top views of a semiconductor structure at various fabrication stages, in accordance with some embodiments.

FIGS. 1B, 2B, 3B, 4B, 5B, 6B, 7B, 8B, 9B, 10B, 11B, 12B, 13B, 14B, 15B, 16B, 17B, 18B, 19B, and 20B are cross sectional views of the semiconductor structure along the dash line A-A of FIGS. 1A, 2A, 3A, 4A, 5A, 6A, 7A, 8A, 9A, 10A, 11A, 12A, 13A, 14A, 15A, 16A, 17A, 18A, 19A, and 20A respectively, in accordance with some embodiments.

FIGS. 1C, 2C, 3C, 4C, 5C, 6C, 7C, 8C, 9C, 10C, 11C, 12C, 13C, 14C, 15C, 16C, 17C, 18C, 19C, and 20C are cross sectional views of the semiconductor structure along the dash line B-B of FIGS. 1A, 2A, 3A, 4A, 5A, 6A, 7A, 8A, 9A, 10A, 11A, 12A, 13A, 14A, 15A, 16A, 17A, 18A, 19A, and 20A respectively, in accordance with some embodiments.

DETAILED DESCRIPTION

Figure 2A:
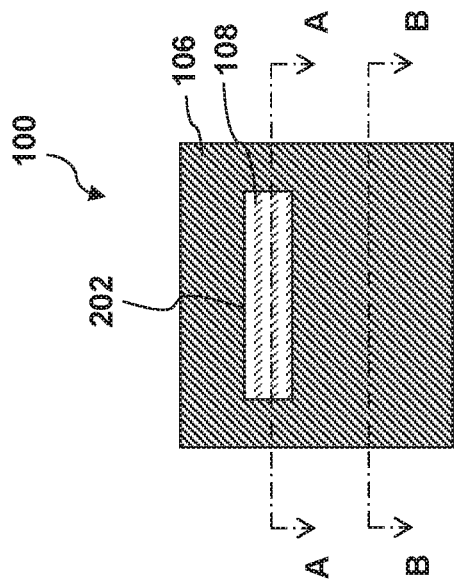

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
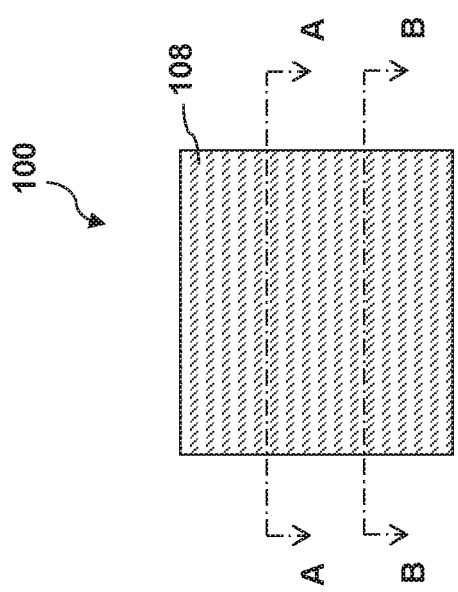
Figure 1B:
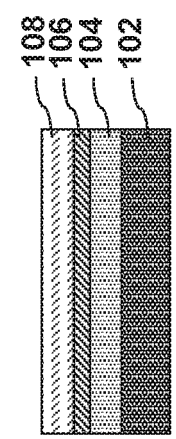
Figure 1C:
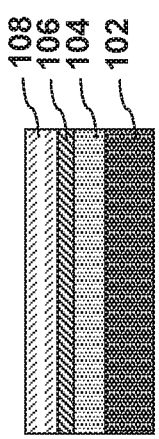

Referring to FIGS. 1A-1C, a substrate 102, a patterning-target layer 104, a first hard mask layer 106, and a first resist layer 108 are provided in a semiconductor structure 100. In some embodiments, the substrate 102 is a semiconductor substrate, such as a semiconductor wafer. The substrate 102 may include silicon in a crystalline structure. In some embodiments, the substrate 102 may include other elementary semiconductor, such as germanium; a compound semiconductor including silicon germanium, silicon carbide, gallium arsenide, indium arsenide, indium phosphide, and/or indium antimonide; an alloy semiconductor including SiGe, GaAsP, AlInAs, AlGaAs, GaInAs, GaInP, and/or GaInAsP; or combinations thereof. In some embodiments, the substrate 102 may be a silicon-on-insulator (SOI) substrate. The substrate 102 may further include additional features and/or material layers, such as various isolation features formed in the substrate. In some embodiments, the substrate 102 may include various doped regions, such as p-type doped regions and/or n-type doped regions configured and coupled to form various devices and functional features. All doping features may be achieved using a suitable process, such as ion implantation in various steps and techniques. In some embodiments, the substrate 102 may include other features, such as shallow trench isolation (STI). The substrate 102 may further include various material layers, such as gate material layers.

Referring to FIG. 1B, the patterning-target layer 104 is formed over the substrate 102. In some embodiments, the patterning-target layer 104 is the layer where the final patterns are formed over the substrate 102. In some embodiments, the patterning-target layer 104 has a thickness in a range from about 5 nm to about 50 nm. In some embodiments, the patterning-target layer 104 is formed using one or more conventional processes known in the art such as, chemical vapor deposition (CVD), spin-on methods, sputtering, oxidation, physical vapor deposition (PVD), atomic layer deposition (ALD), atomic layer CVD (ALCVD), thermal oxidation, and/or other suitable processes. In some embodiments, the patterning-target layer 104 includes one or more dielectric materials, such as silicon oxide ($SiO_2$), and/or silicon nitride ($Si_3N_4$). In some embodiments, the patterning-target layer 104 also includes metallic materials. In some embodiments, the patterning-target layer 104 is an upper portion of the substrate 102.

Referring to FIGS. 1B-1C, the first hard mask layer 106 is formed over the patterning-target layer 104. The first hard mask layer 106 is used to pattern, such as by etching, the patterning-target layer 104 as discussed later in detail in the present disclosure. In some embodiments, the first hard mask layer 106 includes one or more dielectric materials, such as silicon oxide, silicon nitride, and/or silicon oxynitride (SiON). In some embodiments, the first hard mask layer 106 includes titanium nitride (TiN). In some embodiments, the first hard mask layer 106 has a thickness in a range from about 5 nm to about 50 nm. In some embodiments, the first hard mask layer 106 is formed using one or more processes selected from the group consisting of CVD, PVD, ALD, spin-on method, sputtering, thermal oxidation, and a combination thereof.

Referring to FIGS. 1B-1C, in order to pattern the first hard mask layer 106, the first resist layer 108 is formed over the first hard mask layer 106. In some embodiments, the first resist layer 108 is a photoresist layer including chemicals that are sensitive to light, such as UV light. In some embodiments, the first resist layer 108 can also be an electron-beam sensitive layer. In some embodiments, the first resist layer 108 can also be a resist layer sensitive to other radiation, such as X-ray or charged ion beam. The first resist layer 108 may be formed using a spin-on coating method. In some embodiments, the formation of the first resist layer 108 may further include other operations, such as soft baking. The first resist layer 108 may include one or more organic polymer materials. In some embodiments, the first resist layer 106 has a thickness in a range from about 10 nm to about 100 nm. In some embodiments, the resist layer has a multilayer structure, such as two layers or three layers.

Figure 2B:
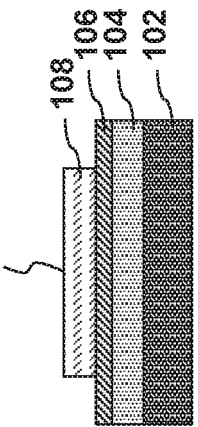
Figure 2C:
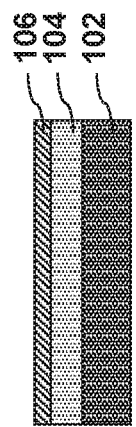

Referring to FIGS. 2A-2C, a lithography process is performed to the first resist layer 108 to form a first cut pattern 202. In some embodiments, the first cut pattern 202 includes one or more lines as shown in FIG. 2A. In some embodiments, the first cut pattern 202 is formed in the first resist layer 108 using a lithography process. In some embodiments, the lithography process includes exposing the first resist layer 108 to a light source (using a mask having the first cut pattern 202 or alternatively using direct write without mask), performing a post-exposure bake process, and developing the first resist layer 108 to remove the portions of the first resist layer 108, so that the first cut pattern 202 can be formed in the first resist layer 108 as shown in FIGS. 2A-2B. In some embodiments, the first cut pattern 202 may include any other suitable features that can be formed using a lithography process.

Referring to FIGS. 3A-3B, the patterned first resist layer 108 is used as a mask to transfer the first cut pattern 202 to the first hard mask layer 106. In some embodiments, the regions that are not covered by the patterned first resist layer 108 are removed using one or more etching processes, leaving the region(s) corresponding to the first cut pattern 202 remain in the first hard mask layer 106 as shown in FIGS. 3A-3B. In some embodiments, the one or more etching processes include a selective dry etch process, such as a plasma etching process, a selective wet etching process, or a combination thereof. In some embodiments when the hard mask layer 106 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, and combinations thereof. In some embodiments when the hard mask layer 106 includes titanium nitride, the etching process includes using an etching gas including at least chlorine ($Cl_2$) or any other suitable etching gases.

After transferring the first cut pattern 202 to the first hard mask layer 106, the first resist layer 108 is removed. In some embodiments, the first resist layer 108 is removed by a wet stripping process, a plasma ashing process, other suitable methods, or combinations thereof. In some embodiments, the plasma ashing process includes using gases including oxygen ($O_2$). As shown in FIG. 3B, the first cut pattern 202 is exposed in the first hard mask layer 106 after removing the first resist layer 108.

Referring to FIGS. 4A-4C, a buffer layer 110 is formed over the first hard mask layer 106 to cover the first cut pattern 202 that is defined in the first hard mask layer 106. A second resist layer 112 is then formed over the buffer layer 110. As shown in FIG. 4B, the buffer layer 110 is formed to cover both the patterning-target layer 104 and the first hard mask layer 106, and to provide a planar top surface. The buffer layer 110 may provide improved optical effect in the lithography process. In some embodiments, the buffer layer 110 includes one or more silicon-containing polymers. In some embodiments, the buffer layer 110 has a thickness in a range from about 10 nm to about 100 nm. In some embodiments, the buffer layer 110 is formed using a spin-on coating method and/or a suitable deposition method.

Referring to FIGS. 4B-4C, the second resist layer 112 is formed over the buffer layer 110. In some embodiments, the second resist layer 112 is a photoresist layer including chemicals that are sensitive to light, such as UV light. In some embodiments, the second resist layer 112 can also be a resist layer sensitive to electron-beam, charged ion-beam or other beam. The second resist layer 112 may be formed using a spin-on coating method. The second resist layer 112 may include one or more organic polymer materials. In some embodiments, the second resist layer 112 has a thickness in a range from about 10 nm to about 100 nm. In some embodiments, the second resist layer 112 includes materials that are substantially similar to the materials of the first resist layer 108.

Referring to FIGS. 5A-5C, a lithography process is performed to the second resist layer 112 to form a patterned second resist layer including a trench 203. The trench 203 may be formed to fabricate a second cut pattern 204 as discussed later in the present disclosure. In some embodiments, the lithography process includes exposing the second resist layer 112 to a light source using a mask, performing post-exposure bake processes, and developing the second resist layer 112 to form the trench 203 in the second resist layer 112 as shown in FIGS. 5A and 5C. The lithography process may further include other operation(s), such as hard baking. In some other embodiments, the trench 203 or the patterned second resist layer 112 may be alternatively formed by other technique, such as electron-beam direct writing.

As shown in FIG. 5A, the spacing $d_1$ between the trench 203 and the first cut pattern 202 may be substantially equal to or less than a minimum spacing value based on the design rules. Although the trench 203 is formed to be parallel to the first cut pattern 202 in FIG. 5A, it is to be understood that the trench 203 may be formed in any suitable angle relative to the first pattern 202. The spacing $d_1$ between the trench 203 and the first cut pattern 202 may also be any suitable distance in consideration of fabrication capability and/or design rules.

Referring to FIGS. 6A-6C, the patterned second resist layer 112 is used as an etching mask to transfer the trench pattern 203 to the buffer layer 110 using one or more etching processes to form the trench pattern 203 in the buffer layer 110 as shown in FIG. 6C. In some embodiments, the one or more etching processes include a selective dry etch process, such as a plasma etching process, a selective wet etching process, or a combination thereof. During the etching processes, the corresponding portions of the buffer layer 110 are selectively etched, while the patterning-target layer 104 remains unetched. In some embodiments, the etching process includes using an etching gas including carbon tetrafluoride ($CF_4$) and/or other suitable etching gases.

After etching the buffer layer 110 to form the trench 203, the second resist layer 112 is removed. The second resist layer 112 may be removed by a wet stripping process, a plasma ashing process, other suitable methods, and/or combinations thereof. In some embodiments, the plasma ashing process includes using gases including oxygen ($O_2$).

Figure 7A:
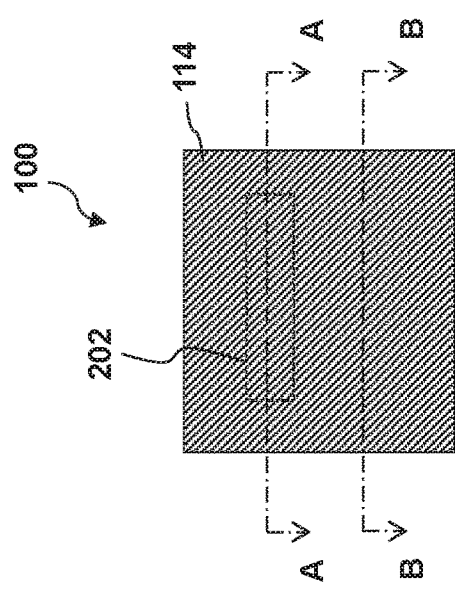
Figure 7B:
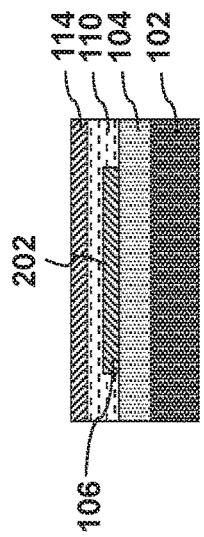
Figure 7C:
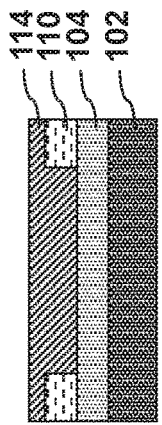

Referring to FIGS. 7A-7B, a second hard mask layer 114 is formed over the buffer layer 110. In some embodiments, the second hard mask layer 114 is formed to fill in the trench 203 as well as to cover the buffer layer 110 as shown in FIG. 7C. The second hard mask layer 114 may be formed to pattern, such as by etching, the patterning-target layer 104 as discussed later in detail in the present disclosure. In the present embodiment, the second hard mask layer 114 is different from the first hard mask layer 106 in composition. In some embodiments, the second hard mask layer 114 and the first hard mask layer 106 may be chosen in composition to have different etching selectivities in the following one or more etching processes so that the second hard mask layer 114 and the first hard mask layer 106 may be used to transfer patterns to different subsets of the features in the main pattern. In some embodiments, the second hard mask layer 114 may include similar materials but different in composition from the materials in the first hard mask layer 106. In some embodiments, the second hard mask layer 114 includes one or more materials, such as SiN, or SiON. In some embodiments, the second hard mask layer 114 has a thickness in a range from about 5 nm to about 50 nm. In some embodiments, the second hard mask layer 114 is formed using one or more processes selected from the group consisting of CVD, PVD, ALD, spin-on method, sputtering, thermal oxidation, and a combination thereof.

Figure 8A:
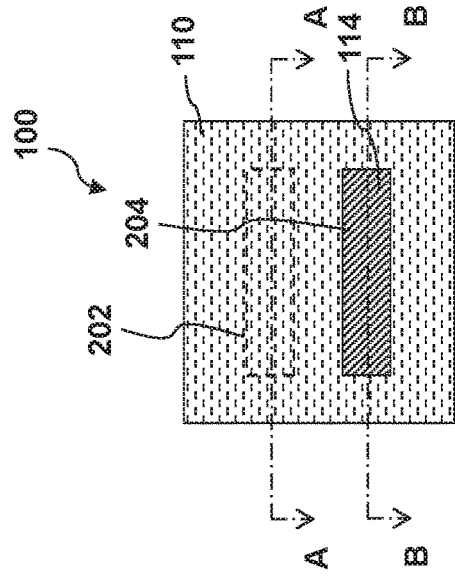
Figure 8B:
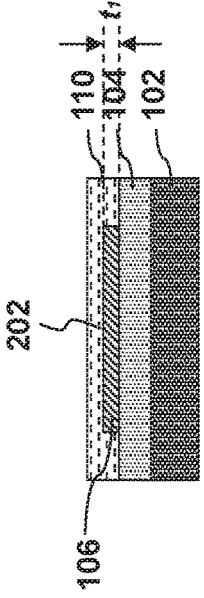
Figure 8C:
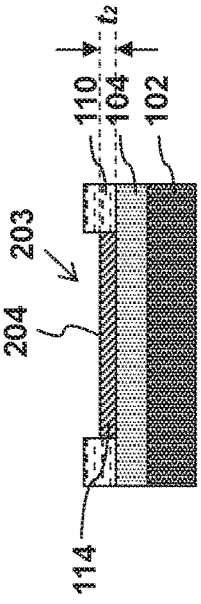

Referring to FIGS. 8A-8C, the second hard mask layer 114 is partially removed. In some embodiment, the upper portions of the second hard mask layer 114 may be removed so that the buffer layer 110 is uncovered. In some embodiment, the upper portions of the second hard mask layer 114 may be removed using a chemical mechanical polish (CMP) method. In some embodiments, the upper portions of the second hard mask layer 114 may be etched using an etch-back process. In some embodiments, a combination of the CMP and etch-back process may also be used to remove the upper portions of the second hard mask layer 114. In some embodiments, the second hard mask layer 114 may be partially etched using a selective dry etch process, such as a plasma etching process, a selective wet etching process, or a combination thereof. In some embodiments when the hard mask layer 114 includes silicon oxide, silicon nitride, and/or silicon oxynitride (SiON), the etching process includes using an etching gas including at least one of carbon tetrafluoride ($CF_4$), difluoromethane ($CH_2F_2$), trifluoromethane ($CHF_3$), other suitable etching gases, and combinations thereof.

As shown in FIG. 8C, the portions of the second hard mask layer 114 that are disposed above the buffer layer 110, and an upper portion of the second hard mask layer 114 disposed in the trench 203 are removed. In some embodiments, the CMP and/or etch-back process is performed so that the thickness $t_1$ of the first hard mask layer 106 is substantially similar to the thickness $t_2$ of the second hard mask layer 114 remained in the trench 203 after etching. After the CMP process and/or the etch-back process as shown in FIGS. 8A-8C, a second cut pattern 204 in the second hard mask layer 114 is formed in the trench 203.

Figure 9A:
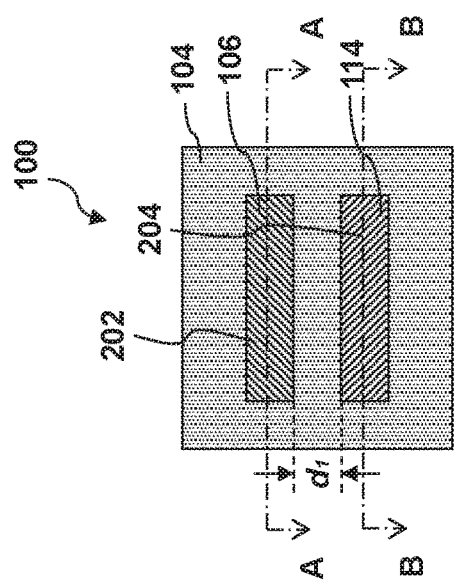
Figure 9B:
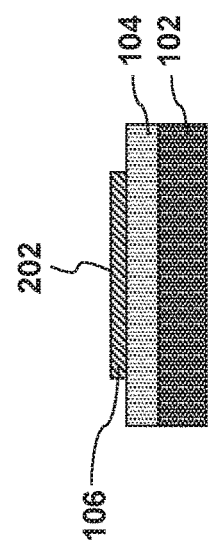
Figure 9C:
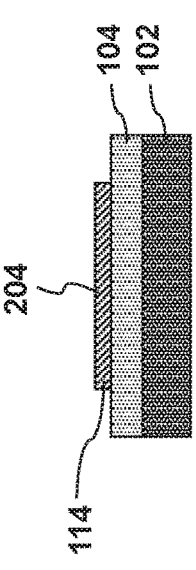

Referring to FIGS. 9A-9C, the buffer layer 110 is removed. In some embodiments, the buffer layer 110 is removed using one or more etching processes including a selective dry etch process, such as a plasma etching process, a selective wet etching process, or a combination thereof. During the removing processes, the buffer layer 110 is selectively removed, while the patterning-target layer 104, the first hard mask layer 106, and the second hard mask layer 114 remain unetched. In some embodiments when the buffer layer 110 includes silicon-containing polymer, the etching process includes using an etching gas including carbon tetrafluoride ($CF_4$) or other suitable etching gases. In some embodiments when the buffer layer 110 includes organic polymer, the etching process includes using an etching gas including at least one of oxygen ($O_2$), carbon dioxide ($CO_2$), nitrogen ($N_2$), hydrogen ($H_2$), or combinations thereof.

As shown in FIGS. 9A-9C, after removing the buffer layer 110, the first cut pattern 202 in the first hard mask layer 106 and the second cut pattern 204 in the second hard mask layer 114 are exposed. The spacing $d_1$ between the first cut pattern 202 and the second cut pattern 204 may be any suitable distance. In some embodiments, the spacing $d_1$ between the first cut pattern 202 and the second cut pattern 204 may be substantially equal to or less than a minimum spacing value based on the design rules. In some embodiments, the $d_1$ may be as small as zero. In some embodiments, the first cut pattern 202 is overlapped with the second cut pattern 204. As discussed in the present disclosure, the first hard mask layer 106 and the second hard mask layer 114 includes different materials so that the etching rates of the first hard mask layer 106 and the second hard mask layer 114 may be different in the following one or more etching processes. The first cut pattern 202 and the second cut pattern 204 may be formed using more than one lithography process. In the present embodiment, the first cut pattern 202 in the first hard mask layer 106 and the second cut pattern 204 in the second hard mask layer 114 are used to cut different subset of features in the main pattern as discussed in the present disclosure.

Figure 10A:
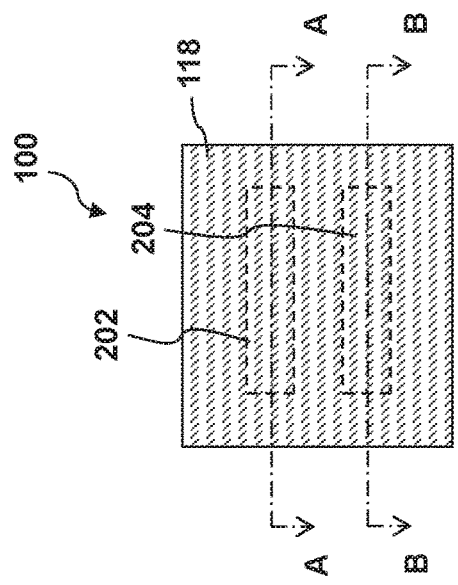
Figure 10B:
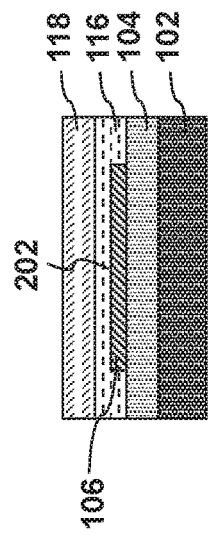
Figure 10C:
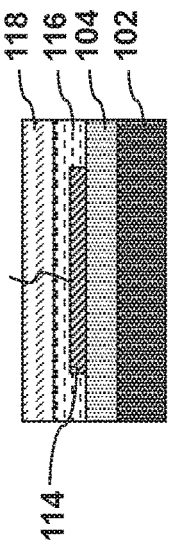

Referring to FIGS. 10A-10C, a buffer layer 116 is formed over the patterning-target layer 104, the first hard mask layer 106, and the second hard mask layer 114. The buffer layer 116 may be formed to cover both the first cut pattern 202 and the second cut pattern 204 as shown in FIG. 10A. In some embodiments, the buffer layer 116 includes organic polymer and/or Si-containing polymer. In some embodiments, the buffer layer 116 includes a multilayer structure. In some embodiments, the buffer layer 116 has a thickness in a range from about 10 nm to about 100 nm. In some embodiments, the buffer layer 116 is formed using a spin-on coating method and/or a suitable deposition method.

Still referring to FIGS. 10A-10C, a third resist layer 118 is formed over the buffer layer 116. In some embodiments, the third resist layer 118 is a photoresist layer including chemicals that are sensitive to light, such as UV light. In some embodiments, the third resist layer 118 can also be a resist layer sensitive to electron-beam or charged ion-beam. In some embodiments, the third resist layer 118 is formed using a spin-on coating method. In some embodiments, the third resist layer 118 includes one or more organic polymer materials. In some embodiments, the third resist layer 118 has a thickness in a range from about 10 nm to about 100 nm.

Figure 11A:
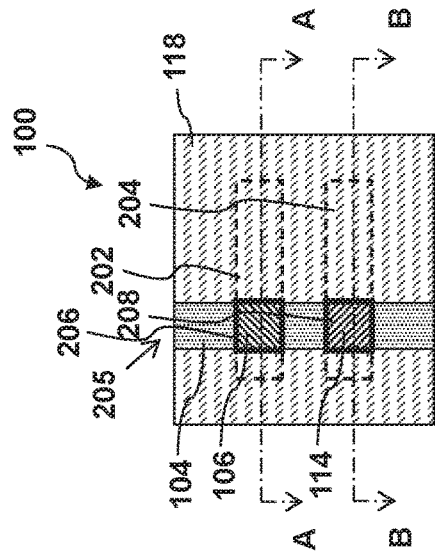
Figure 11B:
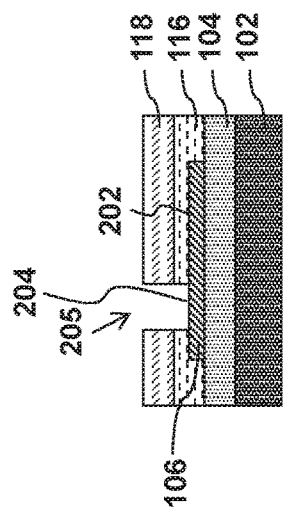
Figure 11C:
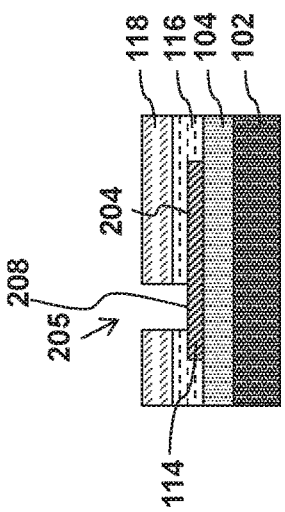

Referring to FIGS. 11A-11C, a lithography process is performed to the third resist layer 118 to form a trench 205. The trench 205 may be formed to form a first subset of features in the main pattern as discussed later in the present disclosure. In some embodiments, the trench 205 is overlap with the first cut pattern 202 and the second cut pattern 204 as shown in FIG. 11A. In some embodiment, the lithography process includes exposing the third resist layer 118 to a light source using a mask, performing post-exposure bake processes, and developing the third resist layer 118 to form the trench 205 in the third resist layer 118 as shown in FIGS. 11A-11C. In some embodiment, the lithography process includes electron beam direct writing or other beam direct writing.

Figure 12A:
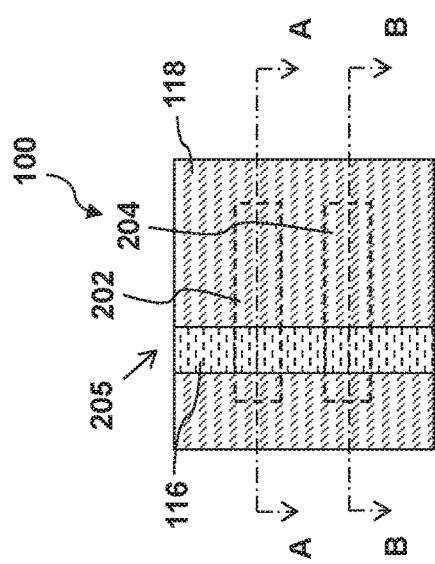
Figure 12B:
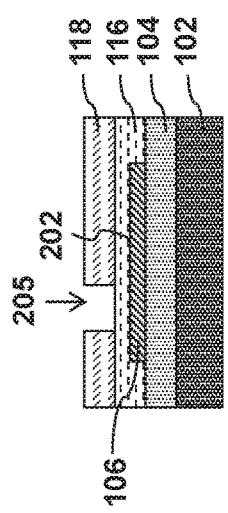
Figure 12C:
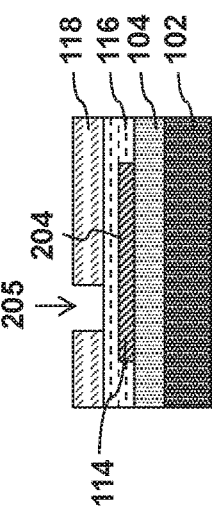

Referring to FIGS. 12A-12C, the patterned third resist layer 118 is used as an etching mask to transfer the trench 205 to the buffer layer 116. In some embodiments, the regions of the buffer layer 116 exposed in the trench 205 are removed using one or more etching processes. In some embodiments, the exposed buffer layer 116 may be etched using one or more etching processes including a selective dry etch process (such as a plasma etching process), a selective wet etching process, or a combination thereof. During the etching processes, the buffer layer 116 is selectively etched, while the patterning-target layer 104, the first hard mask layer 106, and the second hard mask layer 114 remain unetched. In some embodiments when the buffer layer 116 includes silicon-containing polymer, the etching process includes using an etching gas including carbon tetrafluoride ($CF_4$) or other suitable etching gases. In some embodiments when the buffer layer 116 includes organic polymer, the etching process includes using an etching gas including at least one of oxygen ($O_2$), carbon dioxide ($CO_2$), nitrogen ($N_2$), hydrogen ($H_2$), or combinations thereof.

As shown in FIG. 12A, after forming the trench 205 in the buffer layer 116, an overlap portion 206 in the first hard mask layer 106 is exposed. The overlap portion 206 is an overlapping portion between the first cut pattern 202 and the trench 205. An overlap portion 208 in the second hard mask layer 114 is exposed. The overlap portion 208 is an overlapping portion between the second cut pattern 204 and the trench 205. In some examples, one or more of the overlap portion 206 and the overlap portion 208 may be used to cut different subsets of features in the main pattern as discussed later in detail in the present disclosure.

Figure 13A:
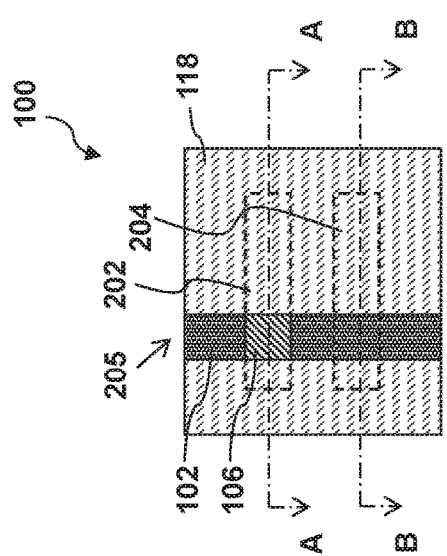
Figure 13B:
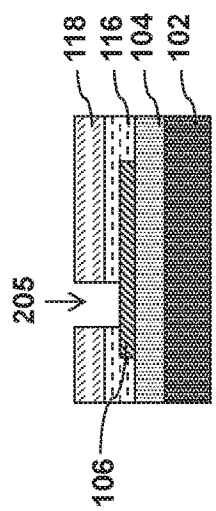
Figure 13C:
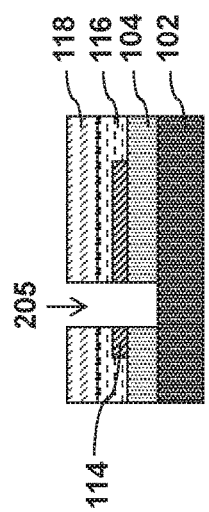

Referring to FIGS. 13A-13C, the patterned resist layer 118 and/or the buffer layer 116 is used as an etching mask to transfer the trench 205 to the patterning-target layer 104. In some embodiments, the exposed portions of the patterning-target layer 104 that are within the trench 205 and are uncovered by the first hard mask layer 106 are removed using an etching process, thereby forming a first subset of main features of the main pattern in the patterning-target layer 104. The first subset of main features is formed in the patterning-target layer 104 using the buffer layer 116 and the first hard mask layer 106 as a collective etch mask. In the present embodiment, the first subset of main features is determined by the first cut pattern 202 and the trench 205. The etching process may include one or more etching steps. In the present embodiment, the exposed portion of the second hard mask layer 114, e.g., the overlap portion 208 of FIG. 12A, is removed as well by the etching process. The etching process is designed to selectively remove the patterning-target layer 104 and the second hard mask layer 114. For example, the etching process includes a first etching operation using a first etchant to selectively remove the second hard mask layer 114 and a second etching operation using a second etchant to selectively remove the patterning-target layer 104.

In some embodiments, the exposed patterning-target layer 104 and the exposed portion of the second hard mask layer 114 may be etched using one or more etching processes. In some examples, the exposed portion of the second hard mask layer 114 and the exposed patterning-target layer 104 may be removed together using a selective etching process leaving the first hard mask layer 106 unetched. In some examples, the exposed second hard mask layer 114 may be first etched using a selective etching process leaving the first hard mask layer 106 and the patterning-target layer 104 unetched, the exposed patterning-target layer 104 may then be etched using a selective etching process leaving the first hard mask layer 106 unetched. The selective etching process for removing the exposed second hard mask layer 114 may include a selective dry etch process, such as a plasma etching process, a selective wet etching process, or a combination thereof. In some embodiments, the first hard mask layer 106 includes titanium nitride (TiN) and the second hard mask layer 114 includes silicon nitride (SiN). The etching process includes using an etching gas including at least one of carbon tetrafluoride ($CF_4$), difluoromethane ($CH_2F_2$), trifluoromethane ($CHF_3$), other suitable etching gases, and combinations thereof. The selective etching process for removing the exposed patterning-target layer 104 may include a selective dry etch process, such as a plasma etching process, a selective wet etching process, or a combination thereof. The etching process includes using an etching gas including at least one of carbon tetrafluoride ($CF_4$), difluoromethane ($CH_2F_2$), trifluoromethane ($CHF_3$), other suitable etching gases, or combinations thereof.

Figure 14A:
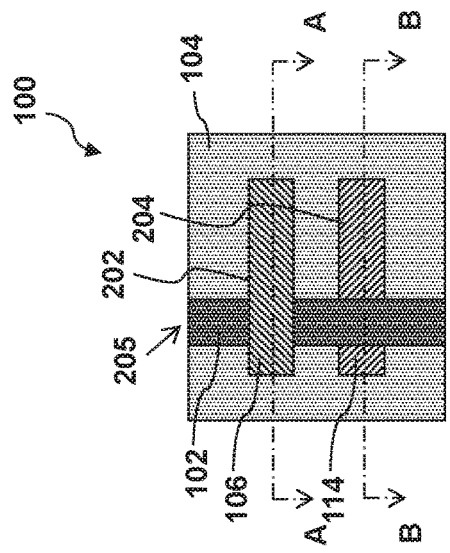
Figure 14B:
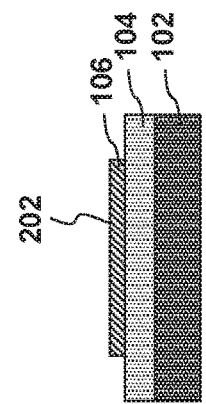
Figure 14C:
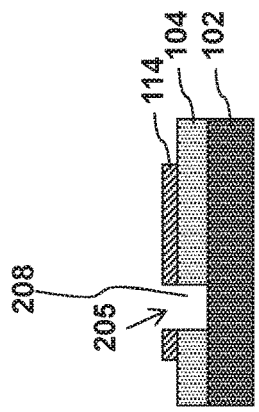

Referring to FIGS. 14A-14C, the third resist layer 118 and the buffer layer 116 are removed. In some embodiments, the third resist layer 118 is removed by a wet stripping process, a plasma ashing process, and/or other suitable methods. In some embodiments, the plasma ashing process includes using gases including oxygen ($O_2$). In some embodiments, the buffer layer 116 is removed using one or more etching processes including a selective dry etch process, such as a plasma etching process, a selective wet etching process, or a combination thereof. In some embodiments, the buffer layer 116 may also be removed using a chemical mechanical polish (CMP) method. During the removing processes, the buffer layer 116 is selectively removed, while the patterning-target layer 104, the first hard mask layer 106, and the second hard mask layer 114 remain unetched. In some embodiments, the etching process may include using an etching gas including carbon tetrafluoride ($CF_4$) and/or other suitable etching gases. After removing the third resist layer 118 and the buffer layer 116, the first cut pattern 202 in the first hard mask layer 106, and the trimmed second cut pattern 204 cut in the second hard mask layer 114 are exposed as shown in FIG. 14A.

Referring to FIGS. 15A-15C, a buffer layer 120 is formed over the patterning-target layer 104, the first hard mask layer 106, and the second hard mask layer 114. The buffer layer 120 may be formed to cover both the first cut pattern 202 and the trimmed second cut pattern 204 as shown in FIGS. 15A-15C. The buffer layer 120 may also be formed to fill in the trench 205 as shown in FIG. 15C. In some embodiments, the buffer layer 120 may include one or more polymers including silicon. In some embodiments, the buffer layer 120 has a thickness in a range from about 10 nm to about 100 nm. In some embodiments, the buffer layer 120 is formed using a spin-on coating method and/or a suitable deposition method.

Still referring to FIGS. 15A-15C, a fourth resist layer 122 is formed over the buffer layer 120. In some embodiments, the fourth resist layer 122 is a photoresist layer including chemicals that are sensitive to light, such as UV light. In some embodiments, the fourth resist layer 122 can also be an electron-beam sensitive layer. In some embodiments, the fourth resist layer 122 is formed using a spin-on coating method. In some embodiments, the fourth resist layer 122 includes one or more organic polymer materials. In some embodiments, the fourth resist layer 122 has a thickness in a range from about 10 nm to about 100 nm.

Referring to FIGS. 16A-16C, a lithography process is performed to the fourth resist layer 122 to form a trench 207. The trench 207 may be formed to form a second subset of features in the main pattern as discussed later in the present disclosure. In some embodiments, the trench 207 may overlap with the first cut pattern 202 and the second cut pattern 204 as shown in FIG. 16A. The lithography process may include exposing the fourth resist layer 122 to a light source using a mask, performing post-exposure bake processes, and developing the fourth resist layer 122 to form the trench 207 in the fourth resist layer 122 as shown in FIGS. 16A-16C. The lithography process may alternatively use direct write without mask, such as electron-beam direct writing.

As shown in FIG. 16A, the spacing $d_2$ between the trench 205 and trench 207 may be substantially equal to or less than a minimum spacing value based on the design rules. Although the trench 207 is formed to be parallel to the trench 205 in FIG. 16A, it is to be understood that the trench 207 may be formed in any suitable angle relative to the trench 205. The spacing $d_2$ between the trench 207 and the trench 205 may also be any suitable distance. In some embodiments, the $d_2$ may be as small as zero. In some embodiments, the trench 207 is overlapped with the trench 205.

Referring to FIGS. 17A-17C, the patterned fourth resist layer 122 is used as an etching mask to transfer the trench 207 to the buffer layer 120. In some embodiments, the regions of the buffer layer 120 exposed in the trench 207 are removed using one or more etching processes. In some embodiments, the exposed buffer layer 120 may be etched using one or more etching processes including a selective dry etch process, such as a plasma etching process, a selective wet etching process, or a combination thereof. During the etching processes, the buffer layer 120 is selectively etched, while the patterning-target layer 104, the first hard mask layer 106, and the second hard mask layer 114 remain unetched. In some embodiments, the etching process may include using an etching gas including carbon tetrafluoride ($CF_4$) and/or other suitable etching gases.

As shown in FIG. 17A, after forming the trench 207 in the buffer layer 120, an overlap portion 210 in the first hard mask layer 106 is exposed. The overlap portion 210 is an overlapping portion between the first cut pattern 202 and the trench 207. An overlap portion 212 in the second hard mask layer 114 is exposed. The overlap portion 212 is an overlapping portion between the second cut pattern 204 and the trench 207. In some examples, one or more of the overlap portion 210 and the overlap portion 212 may be used to cut different subsets of features in the main pattern as discussed later in detail in the present disclosure.

Referring to FIGS. 18A-18C, the patterned resist layer 122 and/or buffer layer 120 is used as an etching mask to transfer the trench 207 to the patterning-target layer 104. In some embodiments, the exposed portions of the patterning-target layer 104 that are within the trench 207 and are uncovered by the second hard mask layer 114 are removed using one or more etching processes, thereby forming a second subset of main features of the main pattern in the patterning-target layer 104. The second subset of main features is formed in the patterning-target layer 104 using the buffer layer 120 and the second hard mask layer 114 as a collective etch mask. In the present embodiment, the second subset of main features is determined by the second cut pattern 204 and the trench 207.

In some embodiments, the first cut pattern 202 is also trimmed by the trench 207 corresponding to the second subset of the main pattern. As shown in FIGS. 18A and 18C, the exposed portion of the first hard mask layer 106, e.g., the second overlap portion 210 is removed.

In some embodiments, the exposed patterning-target layer 104 and the exposed first hard mask layer 106 may be etched using one or more etching processes. In some examples, the exposed first hard mask layer 106 and the exposed patterning-target layer 104 may be removed together using a selective etching process leaving the second hard mask layer 114 unetched. In some examples, the exposed first hard mask layer 106 may be first etched using a selective etching process leaving the second hard mask layer 114 and the patterning-target layer 104 unetched, the exposed patterning-target layer 104 may then be etched using a selective etching process leaving the second hard mask layer 114 unetched. The selective etching process for removing the exposed first hard mask layer 106 may include a selective dry etch process, such as a plasma etching process, a selective wet etching process, or a combination thereof. In some embodiments, the first hard mask layer 106 includes titanium nitride (TiN) and the second hard mask layer 114 includes silicon nitride (SiN). The etching process includes using an etching gas including at least chlorine ($Cl_2$) or any other suitable etching gases or combinations thereof. The selective etching process for removing the exposed patterning-target layer 104 may include a selective dry etch process, such as a plasma etching process, a selective wet etching process, or a combination thereof. The etching process includes using an etching gas including at least one of carbon tetrafluoride ($CF_4$), difluoromethane ($CH_2F_2$), trifluoromethane ($CHF_3$), other suitable etching gases, or combinations thereof.

Referring to FIGS. 19A-19C, the fourth resist layer 122 and the buffer layer 120 are removed. In some embodiments, the fourth resist layer 122 is removed by a wet stripping process, a plasma ashing process, and/or other suitable methods. In some embodiments, the plasma ashing process includes using gases including oxygen (02). In some embodiments, the buffer layer 120 is removed using one or more etching processes including a selective dry etch process, such as a plasma etching process, a selective wet etching process, or a combination thereof. In some embodiments, the buffer layer 120 may also be removed using a chemical mechanical polish (CMP) method. During the removing processes, the buffer layer 120 is selectively removed, while the patterning-target layer 104, the trimmed first hard mask layer 106, and the trimmed second hard mask layer 114 remain unetched. In some embodiments, the etching process may include using an etching gas including carbon tetrafluoride ($CF_4$) and/or other suitable etching gases. After removing the fourth resist layer 122 and the buffer layer 120, the trimmed first cut pattern 202 in the first hard mask layer 106, and the trimmed second cut pattern 204 cut in the second hard mask layer 114 are exposed as shown in FIG. 19A.

Referring to FIGS. 20A-20C, the first hard mask layer 106 and the second hard mask layer 114 are removed to expose the final pattern in the patterning-target layer 104. In some embodiments, the first hard mask layer 106 and the second hard mask layer 114 are removed using a chemical mechanical polish (CMP) process. In some embodiments, the first hard mask layer 106 and the second hard mask layer 114 are removed using one or more etching processes. The etching processes may include a selective dry etch process, such as a plasma etching process, a selective wet etching process, or a combination thereof. During the etching processes, the first hard mask layer 106 and the second hard mask layer 114 may be selectively etched, while the patterning-target layer 104 remains unetched. In some embodiments, the first hard mask layer 106 includes titanium nitride (TiN) and the second hard mask layer 114 includes silicon nitride (SiN). The etching process includes using an etching gas including at least chlorine ($Cl_2$) or any other suitable etching gases, or combinations thereof. In some embodiments, the hard mask layers 106 and 114 may also be removed using a chemical mechanical polish (CMP) process.

As shown in FIGS. 20A-20C, the final pattern may include a trimmed trench line 205 and a trimmed trench line 207 in the patterning-target layer 104. The trimmed trench line 205 and the trimmed trench line 207 may be formed separately and independently using different cut patterns, without affecting each other. In some embodiments, the spacing $d_1$ between the trimmed portion of the trench line 205 and trimmed portion of the trench line 207 may be any suitable distance. In some embodiments, the spacing $d_1$ may be substantially equal to or less than a minimum spacing value based on the design rules. In some embodiments, the spacing $d_2$ between the trench line 205 and the trench line 207 may be any suitable distance, for example, the spacing $d_2$ may be substantially equal to or less than a minimum spacing value based on the design rules.

Figure 21:
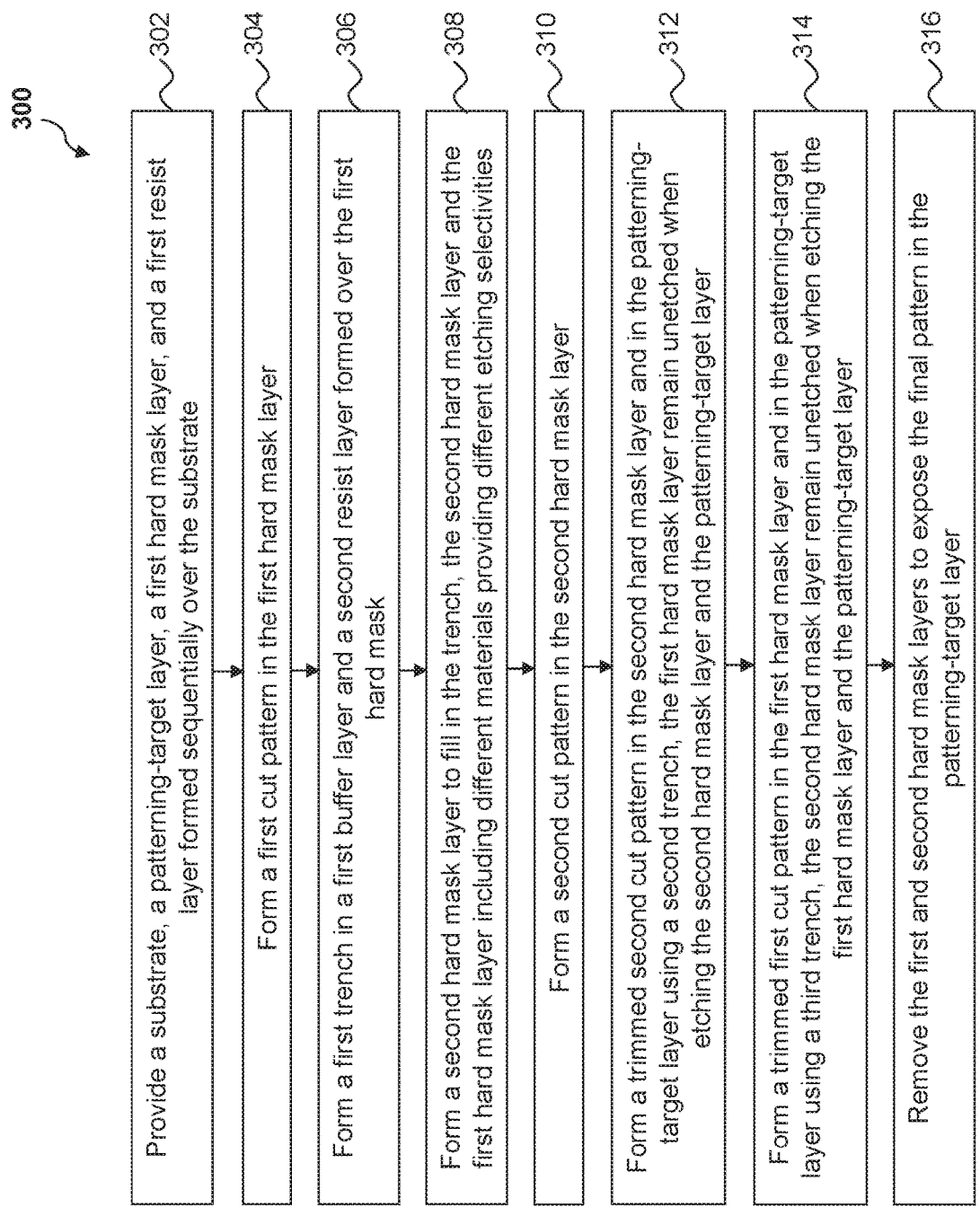
FIG. 21 is a flowchart showing a method of forming patterns using multiple lithography processes in the semiconductor structure, in accordance with some embodiments.

FIG. 21 illustrates a method 300 of forming patterns using multiple lithography processes combined with multiple etching processes in the semiconductor structure 100 as discussed with reference to FIGS. 1A-1C to 20A-20C. Method 300 starts from operation 302 by providing the substrate 102, the patterning-target layer 104 formed over the substrate 102, and the first hard mask layer 106 formed on the patterning-target layer 104, and the first resist layer 108 formed over the first hard mask layer 106. The patterning-target layer 104 and/or the first hard mask layer 106 may be formed by one or more processes selected from the group consisting of CVD, PVD, ALD, spin-on method, sputtering, thermal oxidation, and a combination thereof. The first resist layer 108 may be formed using a spin-on coating method.

Method 300 proceeds to operation 304 by forming a first cut pattern 202 in the first hard mask layer 106. In some embodiments, the first cut pattern 202 includes one or more line features. In some embodiments, the first cut pattern 202 is first formed in the first resist layer 108 using a lithography process. In some embodiments, the lithography process includes exposing the first resist layer 108 to a light source, performing post-exposure bake processes, and developing the first resist layer 108. The first cut pattern 202 is then transferred to the first hard mask layer 106 by one or more etching processes using the patterned first resist layer 108 as an etching mask. In some embodiments, the first resist layer 108 is then removed by a wet stripping process, a plasma ashing process, and/or other suitable methods.

Method 300 proceeds to operation 306 by forming a trench in a first buffer layer 110 and a second resist layer 112. The first buffer layer 110 may be formed over the first hard mask layer 106, and the second resist layer 112 may be formed over the first buffer layer 110. A lithography process and one or more etching processes may be used to form a trench 203 in the second resist layer 112 and the first buffer layer 110. The second resist layer 112 may then be removed.

Method 300 proceeds to operation 308 by forming a second hard mask layer 114 to fill the trench 203. The second hard mask layer 114 may include materials different from the materials used to form the first hard mask layer 106. The second hard mask layer 114 and the first hard mask layer 106 may have different etching selectivities.

Method 300 proceeds to operation 310 by forming a second cut pattern 204 in the second hard mask layer 114. The second cut pattern 204 in the second hard mask layer 116 may be formed by a CMP process and/or an etch-back process. In some embodiments, the thickness $t_1$ of the first hard mask layer 106 may be substantially similar to the thickness $t_2$ of the second hard mask layer 114 after the etching process at operation 310. The first buffer layer 110 may then be removed using one or more etching processes.

Method 300 proceeds to operation 312 by forming a trimmed second cut pattern in the second hard mask layer 114 and the patterning-target layer 104. A second buffer layer 116 may be formed over the first and the second hard mask layers, and a third resist layer 118 may be formed over the second buffer layer 116. A lithography process and one or more etching processes may be used to form a trench 205 in the third resist layer 116 and the second buffer layer 116. The trench 205 may be transferred to the second cut pattern 204 in the second hard mask layer 114 and the patterning-target layer 104 using one or more selective etching processes. The selective etching processes may include etching the second hard mask layer 114 and the patterning-target layer 104 without etching the first hard mask layer 106. In some embodiments, the second hard mask layer 114 and the patterning-target layer 104 may be etched together in one step. In some embodiments, the second hard mask layer 114 may be etched first and then the patterning-target layer 104 may be etched to form the trimmed second cut pattern. The second buffer layer 116 and the third resist layer 118 may be then removed to expose the first hard mask layer and the trimmed second hard mask layer.

Method 300 proceeds to operation 314 by forming a trimmed first cut pattern in the first hard mask layer 106 and the patterning-target layer 104. A third buffer layer 120 may be formed over the first and the second hard mask layers, and a fourth resist layer 122 may be formed over the third buffer layer 120. A lithography process and one or more etching processes may be used to form a trench 207 in the fourth resist layer 122 and the third buffer layer 120. The trench 207 may be transferred to the first cut pattern 202 in the first hard mask layer 106 and the patterning-target layer 104 using one or more selective etching processes. The selective etching processes may include etching the first hard mask layer 106 and the patterning-target layer 104 without etching the second hard mask layer 114. In some embodiments, the first hard mask layer 106 and the patterning-target layer 104 may be etched together in one step. In some embodiments, the first hard mask layer 106 may be etched first and then the patterning-target layer 104 may be etched to form the trimmed first cut pattern. The third buffer layer 120 and the fourth resist layer 122 may be then removed to expose the first trimmed hard mask layer and second trimmed hard mask layer.

Method 300 proceeds to operation 316 by removing the first trimmed hard mask layer 106 and the second trimmed hard mask layer 114 to form the final pattern in the patterning-target layer 104. In some embodiments, the first hard mask layer 106 and the second hard mask layer 114 may be removed using a CMP process. The first hard mask layer 106 and the second hard mask layer 114 may also be selectively etched, while the patterning-target layer 104 remains unetched.

The present embodiments describe one or more manufacturable and low-cost mechanisms for forming patterns in semiconductor devices using multiple lithography processes and multiple etching processes. The mechanisms involve forming multiple cutting patterns having different etching selectivity from each other. The mechanisms also involve using the multiple cutting patterns to reshape different subsets of features in the main pattern correspondingly. The mechanisms also involve using multiple lithography processes to form multiple cutting patterns, and using multiple lithography processes and etching processes to reshape the different subsets of features.

The mechanisms discussed in the present disclosure enable reshaping different subsets of features in the main patterns using different cut patterns respectively without affecting each other. The mechanisms also enable forming the spacing between the first and second subset of features, and the spacing between the first trimmed portion and the second trimmed portion flexible because multiple lithography processes and multiple etching processes are used in the present disclosure. In some embodiments, as the first cut pattern and the second cut pattern are formed with different materials, the different subsets of features in the main pattern are transferred to the patterning-target layer with respective etching processes that are etch-selective to the first and second cut patterns, selectively. Accordingly, the cut patterns can be designed with more freedoms and design margins, such as greater dimensions. The mechanisms discussed in the present disclosure are applicable to other lithography process, such as extreme ultraviolet lithography (EUV), or electron-beam direct write (EBDW) process.

The mechanisms are also applicable for generating the guide pattern for direct self-assembly (DSA) process. In a DSA process, a block copolymer material is employed to form a circuit pattern, such as main patterns. In one example for illustration, the block copolymer includes poly(styrene)-block-poly(methyl methacrylate) or PS-b-PMMA. The DSA process combines lithographically defined physical or chemical features to guide self-assembled polymers to create features smaller than those possible with conventional lithography. The DSA process includes deposition and etching. In some examples, the ways to control self-guidance (or alignment) includes graphoepitaxy and chemical surface modification.

The present disclosure provides a method for forming patterns in a semiconductor device. In accordance with some embodiments, the method includes providing a substrate and a patterning-target layer formed over the substrate; forming a first cut pattern in a first hard mask layer formed over the patterning-target layer; forming a second cut pattern in a second hard mask layer formed over the patterning layer, the first hard mask layer having a different etching selectivity from the second hard mask layer; selectively removing a portion of the second cut pattern in the second hard mask layer and a portion of the patterning-target layer within a first trench; and selectively removing a portion of the first cut pattern in the first hard mask layer and a portion of the patterning-target layer within a second trench.

The present disclosure provides yet another embodiment of a method for forming patterns in a semiconductor device. In accordance with some embodiments, the method includes providing a substrate, a patterning-target layer formed over the substrate, and a first hard mask layer formed over the patterning-target layer; performing a first lithography to form a first cut pattern in the first hard mask layer, the first hard mask layer including a first material; forming a buffer layer over the first hard mask layer; performing a second lithography to form a first trench in the buffer layer; forming a second cut pattern in a second hard mask layer in the first trench, the second hard mask layer including a second material; forming a first resist layer over the first hard mask layer and the second hard mask layer; performing a third lithography to form a second trench in the first resist layer; etching the second hard mask layer within the second trench using the first resist layer as an etching mask; forming a second resist layer over the first hard mask layer and the second hard mask layer; performing a fourth lithography to form a third trench in the second resist layer; and etching the first hard mask layer within the third trench using the second resist layer as an etching mask.

The present disclosure provides yet another embodiment of a method for forming patterns in a semiconductor device. In accordance with some embodiments, the method includes forming a first cut pattern in a first hard mask layer using a first lithography, the first hard mask layer being formed over a patterning-target layer; forming a second cut pattern in a second hard mask layer using a second lithography, the second hard mask layer being formed over the patterning layer; forming a first trench in a first material layer formed over the first hard mask layer and the second hard mask layer; etching a portion of the second hard mask layer and the patterning-target layer exposed within the first trench to define a first trimmed trench line; forming a second trench in a second material layer formed over the first hard mask layer and the second hard mask layer; and etching a portion of the first hard mask layer and the patterning-target layer exposed within the second trench to define a second trimmed trench line, wherein the first hard mask layer having a different etching selectivity from the second hard mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   providing a substrate having a target layer disposed over the substrate and a first hard mask layer disposed over the target layer;
   patterning the first hard mask layer;
   forming a first buffer layer having a first portion on the patterned first hard mask layer and a second portion on the target layer;
   patterning the second portion of the first buffer layer to expose the target layer;
   forming a second hard mask layer on the first portion of the first buffer layer and on the target layer where the second portion of the first buffer layer has been removed;
   patterning the second hard mask layer to remove the second hard mask layer from on top of the first buffer layer while leaving the second hard mask layer on the target layer;
   thereafter removing the first buffer layer from the target layer;
   etching through the patterned first hard mask layer to form a first trench in the target layer such that the patterned second hard mask layer protects a first portion of the target layer underlying the patterned second hard mask layer; and
   prior to etching through the patterned first hard mask layer to form the first trench in the target layer, etching through the patterned second hard mask layer to form a second trench in the target layer such that the patterned first hard mask layer protects a second portion of the target layer underlying the patterned first hard mask layer.

2. The method of claim 1, wherein the first buffer layer is formed such that the first portion of the first buffer layer is disposed on and physically contacts top and side surfaces of the patterned first hard mask layer.

3. The method of claim 2, wherein the first buffer layer is formed such that the second portion of the first buffer layer physically contacts the target layer.

4. The method of claim 1, wherein the etching through the first hard mask layer to form the first trench includes:
   forming a second buffer layer on the first hard mask layer and the second hard mask layer;
   patterning the second buffer layer to expose the first hard mask layer and the second hard mask layer; and
   selectively etching the first hard mask layer and the first portion of the target layer without significant etching of the second hard mask layer.

5. The method of claim 4, wherein the second buffer layer is formed to physically contact top and side surfaces of the first hard mask layer and top and side surfaces of the second hard mask layer.

6. The method of claim 4, wherein the etching through the second hard mask layer to form the second trench includes:
   forming a third buffer layer on the first hard mask layer and the second hard mask layer;
   patterning the third buffer layer to expose the first hard mask layer and the second hard mask layer; and
   selectively etching the second hard mask layer and the second portion of the target layer without significant etching of the first hard mask layer.

7. The method of claim 1, wherein the patterning of the first hard mask layer defines a first cut feature in the first hard mask layer that extends beyond the first trench and the second trench in a first direction.

8. The method of claim 7, wherein the patterning of the second hard mask layer defines a second cut feature in the second hard mask layer that extends beyond the first trench and the second trench in the first direction.

9. The method of claim 8, wherein a spacing between the first cut feature and the second cut feature is substantially similar to a spacing between the first trench and the second trench.

10. The method of claim 1, wherein the patterning of the first hard mask layer defines a first cut feature in the first hard mask layer that extends perpendicular to the first trench and the second trench.

11. The method of claim 1, wherein a thickness of the second hard mask layer after the etching of the second hard mask layer to remove from on top of the first buffer layer is substantially similar to a thickness of the first hard mask layer.

12. The method of claim 1, wherein the patterning of the first hard mask layer includes:
    forming a photoresist material over the first hard mask layer;
    performing a lithography process on the photoresist material;
    developing the photoresist material such that a first portion of the first hard mask layer is exposed and a second portion of the first hard mask layer is covered by the photoresist material;
    etching to remove the first portion of the first hard mask layer without removing the second portion of the first hard mask layer; and
    removing the photoresist material.

13. The method of claim 1, wherein the first hard mask layer and the second hard mask layer are configured to have different etching selectivities.

14. The method of claim 1, wherein:
    the first hard mask layer includes a material selected from a group consisting of: silicon oxide, silicon nitride, silicon oxynitride, and titanium nitride, and
    the second hard mask layer includes a material that is different from the material of the first hard mask layer and is selected from a group consisting of: silicon nitride and silicon oxynitride.

15. A method comprising:
    forming a target layer over a semiconductor substrate;
    forming a patterned first hard mask layer over the target layer;
    forming a first buffer layer over the patterned first hard mask layer;
    removing a first portion of the buffer layer to expose a portion of the target layer while a second portion of the buffer layer covers the patterned first hard mask layer;
    forming a patterned second hard mask layer directly on the exposed portion of the target layer;
    removing the second portion of the first buffer layer from over the patterned first hard mask layer;
    etching through the patterned first hard mask layer to form a first trench in the target layer such that the patterned second hard mask layer protects a first portion of the target layer underlying the patterned second hard mask layer; and prior to etching through the patterned first hard mask layer to form the first trench in the target layer, etching through the patterned second hard mask layer to form a second trench in the target layer such that the patterned first hard mask layer protects a second portion of the target layer underlying the patterned first hard mask layer.

16. The method of claim 15, wherein the forming of the patterned second hard mask layer directly on the target layer includes:
   depositing a second mask layer directly on the target layer and directly on the second portion of the buffer layer; and
   removing the second hard mask layer from over the second portion of the buffer layer to form the patterned second hard mask layer.

17. The method of claim 15, wherein after the removing of the second portion of the first buffer layer from over the patterned first hard mask layer, respective top surfaces of the patterned first hard mask layer and the patterned second hard mask layer are exposed.

18. The method of claim 15, wherein the target layer includes is a layer selected from the group consisting of a dielectric layer and a metal layer.

19. The method of claim 15, further comprising removing the patterned first hard mask layer and the patterned second hard mask layer after etching through the patterned second hard mask layer to form the second trench in the target layer.

20. A method comprising:
   forming a target layer over a semiconductor substrate, wherein the target layer is formed of a material selected from the group consisting of a dielectric material and a metallic material;
   forming a patterned first hard mask layer directly on the target layer;
   forming a first buffer layer directly on the patterned first hard mask layer and directly on a portion of the target layer;
   removing a first portion of the buffer layer to expose the portion of the target layer while a second portion of the buffer layer covers the patterned first hard mask layer;
   forming a patterned second hard mask layer directly on the exposed portion of the target layer and directly on a top surface of the second portion of the buffer layer;
   removing the patterned second hard mask layer from the top surface of the second portion of the buffer layer;
   removing the second portion of the first buffer layer from over the patterned first hard mask layer;
   etching through the patterned first hard mask layer to form a first trench in the target layer such that the patterned second hard mask layer protects a first portion of the target layer underlying the patterned second hard mask layer; and
   prior to etching through the patterned first hard mask layer to form the first trench in the target layer, etching through the patterned second hard mask layer to form a second trench in the target layer such that the patterned first hard mask layer protects a second portion of the target layer underlying the patterned first hard mask layer.

* * * * *